United States Patent [19]

Tan

[11] Patent Number: 4,682,857

[45] Date of Patent: Jul. 28, 1987

[54] LIQUID CRYSTAL HOT SPOT DETECTION WITH INFINITESIMAL TEMPERATURE CONTROL

[76] Inventor: Peng Tang, 20674 Acadia Ct., Cupertino, Calif. 95014

[21] Appl. No.: 718,866

[22] Filed: Apr. 2, 1985

[51] Int. Cl.⁴ .................................... G01R 31/22
[52] U.S. Cl. .................... 350/331 T; 324/158 R
[58] Field of Search .............. 350/331; 219/482; 324/158 R

[56] References Cited

U.S. PATENT DOCUMENTS 4,242,635 12/1980 Burns ........................ 350/331 R

OTHER PUBLICATIONS

John Hiatt, "A Method of Detecting Hot Spots On Semiconductors Using Liquid Crystals," 19th Annual Proceedings of the IEEE Reliability Physics Symposium, 1981, pp. 130–133.
E. M. Fleuren, "A Very Sensitive, Simple Analysis Technique Using Nematic Liquid Crystals," 21st Annual Proceedings of the IEEE Reliability Physics Symposium, 1983, pp. 148–149.
J. L. Fergason, "Liquid Crystals in Nondestructive Testing," Applied Optics, vol. 7, No. 9, Sep. 1968, pp. 1729–1737.
G. D. Dixon, "Cholesteric Liquid Crystal in Nondestructive Testing," Material Evaluation, Jun. 1977, pp. 51–55.
Peng Tan and David Burgess, "Improved Sensitivity for Hot Spot Detection Using Liquid Crystal", 22nd Annual Proceeding of the IEEE Reliability Physics Symposium, 1984, pp. 119–121.

*Primary Examiner*—Donald A. Griffin

[57] ABSTRACT

This improvement is the process of using a few well collimated and even radiative heating lights to heat up the liquid crystal film, which is spread over the surface of the die of an integrated circuit. The radiative heating of the liquid crystal film from the top helps to form an even temperature profile on the liquid temperature film. The rapid time response of the heating filament temperature and the radiative heating process induces a rapid response in the liquid crystal film temperature. By repeatedly turning on and turning off the heating lights at an appropriate power setting, the temperature of the liquid crystal film will repeatedly rise above and drop below the liquid crystal phase transition temperature. During this temperature rise and drop process, the liquid crystal film temperature is brought to infinesimally close below to the liquid crystal phase transisiton temperature, for a limited length of time. We call this temperature control process the infinitesimal temperature control method. During this limited length of time, a small ohmic heating dissipated from the die into the liquid crystal film would induce a localized phase transition in the liquid crystal film. Under a cross polarized light, the nematic liquid phase transition process exhibit a change in the liquid crystal's transparency and colors. The transition process is most easily visible when the die is periodically dissipating heat into the liquid crystal film at a 1.2 Hz and at 50% duty cycle. At this periodic heat dissipating mode, the periodic phase transistion induces a blinking appearance at the region where the phase transition is taking place. I call this blinking the 'hot spot induced blinking'. This periodic ohmic heating is accompanied with periodic voltage change in the die. The voltage changes will induce a blinking appearance similar to the hot spot induced blinking. With the use of the infinitesimal temperature control method to vary the ambient temperature of the liquid crystal film the blinking spot size of the hot spot induced blinking increases as the ambient temperature increases. But the blinking spot size of the voltage induced blinking does not respond to temperature changes, as long as the liquid crystal's temperature is not beyond the phase transition temperature. Thus, the varied heating light provide a means to differentiate the two types of blinkings. We have illustrated heating lights as the means of heating up the liquid crystal film. However, if the heating lights were replaced by other heating means, such as a conductive hot plate, or a convective oven, the infinitesimal temperature control method would still work, as long as these alternate heating means were operated at a repeatedly turning on and turning off mode. Therefore, this hot spot detection process will also work well with other heating means.

11 Claims, 2 Drawing Figures

SET UP OF THE INVENTION

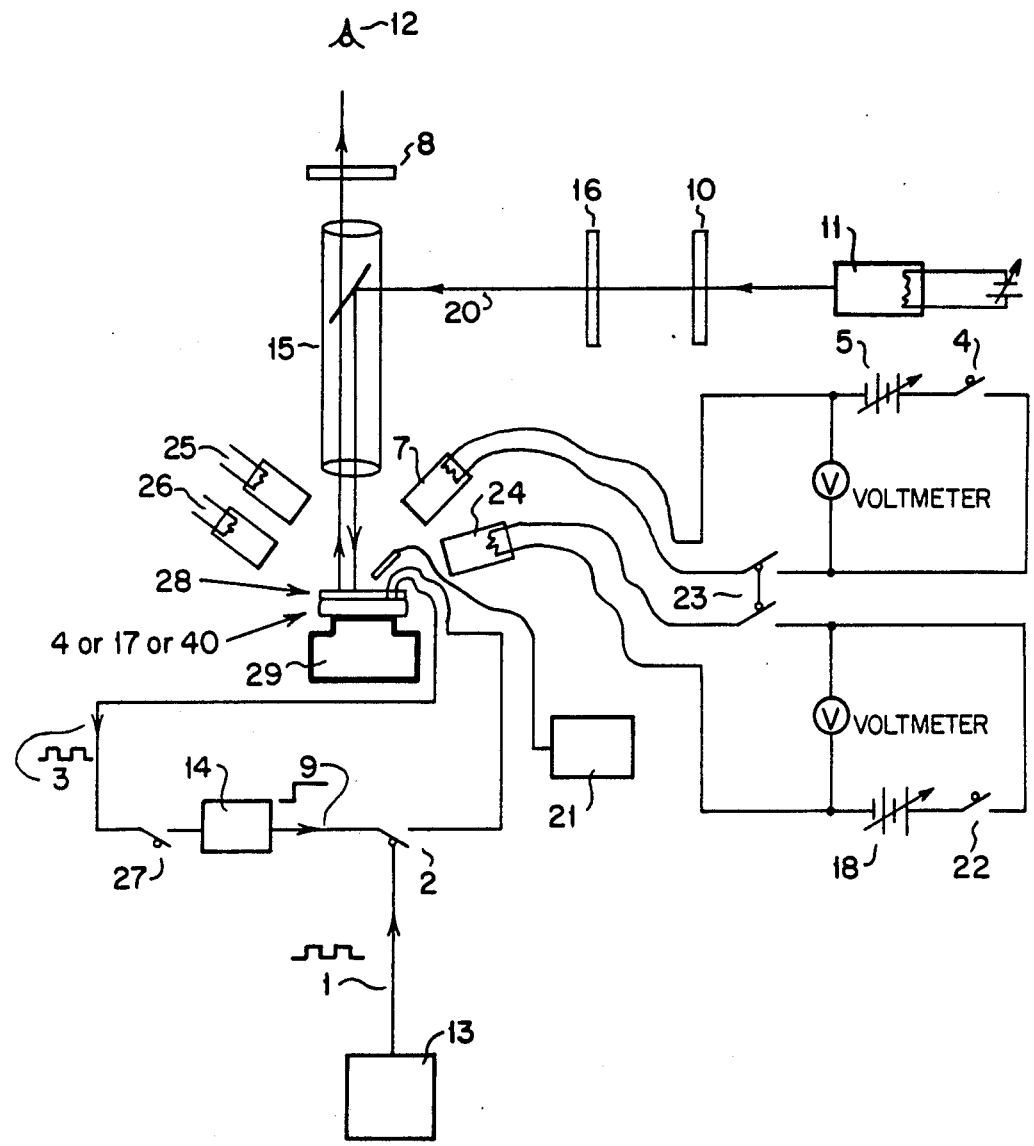
SET UP OF THE INVENTION
FIG._1

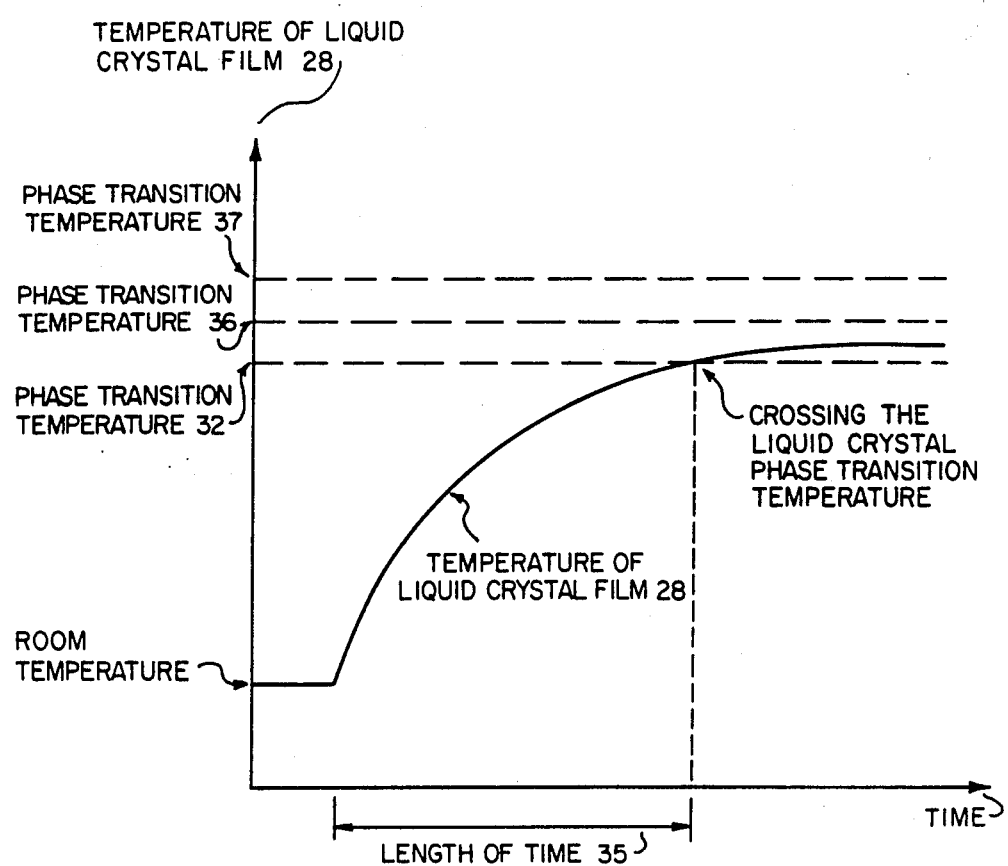
THE TEMPERATURE OF LIQUID CRYSTAL
FILM AND THE HEATING UP TIME
FIG._2

LIQUID CRYSTAL HOT SPOT DETECTION WITH INFINITESIMAL TEMPERATURE CONTROL

BACKGROUND OF THE INVENTION

There are two distinct ways of using the liquid crystal properties for analyzing integrated circuits. These are:

(A) using the light scattering property of the liquid crystal (see reference 3 and 4), and (B) the phase transition property of the liquid crystal (see reference 1 and 2).

This invention uses the phase transition property of the liquid crystal. Therefore, the discussion shall be limited to the hot spot detection method.

There are three kinds of liquid crystals: cholesteric, nematic and smectic. Both the cholesteric and nematic liquid crystal have been used for detecting hot spot (see reference 1 and 2). John Hiatt (see reference 1) reported that with a cross polarized light and a LC-127 cholesteric liquid crystal, he obtained a spatial resolution of ten to twenty microns. Also, the heating was not used, therefore the lowest detectable power of the hot spot is in the range of one hundred to two hundred milliwatts. E. M. Fleuren (see reference 2) reported the use of a N5 nematic liquid crystal phase to detect hot spots. The particular nematic liquid he used is called N5. He used a P.I.D. control and achieved a constant temperature of 0.1 degree celsius to a specified temperature. He could routinely detect a hot spot of 100 microwatts or more, with the P.I.D. control. However, by chance, if the liquid crystal's ambient temperature happens to be much less than 0.1 degree celsius (say a 0.005 degree celsius) below the liquid crystal phase transition temperature, he could detect a lower power hot spot. He managed to detect a hot spot of 3.6 microwatts once.

For a liquid crystal hot spot detection method, the lowest amount of integrated circuit energy required to induce a liquid crystal phase transition is proportional to the difference between the liquid crystal phase transition temperature and the liquid crystal film's temperature. Before this invention, the temperature control process is to keep the liquid crystal temperature constant. The disadvantage of the constant temperature method was that there is no instrument that could control a temperature infinitesimally close to a specified temperature, thus most low power hot spots cannot be detected. Also, prior to this invention, the heating mode was either conductive (see reference 2) or no heating at all (see referehce 1). The liquid crystal film's temperature responds slowly to the conductive heat transfer, because a large poor heat conductor exists between the liquid crystal film and the conductive heating system. The same large poor heat conductor induces an uneven temperature profile on the liquid crystal film, thus reducing the sensitivity of the liquid crystal hot spot detection method.

This invention invented an infinitesimal temperature control method. This method enables the liquid crystal film's temperature to be brought to infinitesimally close below to the liquid crystal phase transition temperature. Therefore, a low power hot spot with only one or two microwatts could be routinely detected. The infinitesimal temperature control method can be achieved by many forms of heating means, such as, but not limited to, a conductive hot plate, a convective oven or a radiative heating light. All these heating means work with various degrees of effectiveness in the invented infinitesimal temperature control method. The key to the said infinitesimal temperature control method is that the heating means operates in a repeatedly turning on and turning off mode. It is during the turning on mode that the heating means will gradually heat up the liquid crystal film and will bring the film temperature infinitesimally close below to the liquid crystal phase transition temperature. To illustrate the said infinitesimal temperature control method, a detailed radiative heating light heating system is described in the SUMMARY OF THE INVENTION and the DETAILED DESCRIPTION OF THE INVENTION.

It should be emphasized that it is not the detailed design of the heating means that contributes to the primary success of bringing the liquid crystal film temperature infinitesimally close below to the liquid crystal phase transition temperature, rather it is the invented method of operating the heating means at a repeatedly turning on and turning off mode. The sensitivity of this invention was helped by using a pulsing input to the hot spot. The pulsing input induces a voltage induced blinking which can be mistaken for the hot spot induced blinking. The difficulty arising from the inability to differentiate between a voltage induced blinking and a hot spot induced blinking was solved by a differentiation method invented by this invention, that is, by observing the temperature responses of these two kinds of blinkings: The hot spot induced blinking increases in blinking spot size as the liquid crystal temperature rises, the voltage induced blinking remains in blinking spot size as the liquid crystal temperature rises.

Reference 1: John Hiatt, "A Method of Detecting Hot Spots on Semiconductors using Liquid Crystals." 19th Annual Proceedings of the IEEE Reliability Physics Symposium, 1981, Pg. 130–133.

Reference 2: E. M. Fleuren, "A very sensitive, simple analysis technique using nematic liquid crystals," 21st Annual Proceedings of the IEEE Reliability Physics Symposium, 1983, Pg. 148–149.

Reference 3: J. L. Fergason, "Liquid crystals in nondestructive testing," Applied Optics, Vol. 7, No. 9, Sept. 1968 Pg. 1729–1737.

Reference 4: G. D. Dixon, "Cholesteric liquid crystal in nondestructive testing," Material Evaluation, June 1977, Pg. 51–55.

SUMMARY OF THE INVENTION

This invention invented a few processes that significantly improve the effectiveness of the liquid crystal hot spot detection method in terms of the ability to detect the lowest power hot spot on a die or wafer. These invented processes, new use of certain liquid crystals, and hardware include, but are not limited to, the following items:

Item (1): The new use of a few nematic liquid crystals for the liquid crystal hot spot detection method;

Item (2): A new process to judge and obtain an optimal thickness of nematic liquid crystal film that is most suitable for the liquid crystal hot spot detection method;

Item (3): A new process to differentiate the voltage induced blinking from the hot spot induced blinking when current input to the die or wafer is operated at a pulsing mode. The hot spot induced blinking site is where the hot spot is located;

Item (4): A new process to operate the heating device that means to control the temperature of the liquid crystal film. The process consists of repeatedly turning on and turning off the heating device. The process results in the temperature of the liquid crystal repeatedly rising above and dropping below the liquid crystal phase transition temperature. During the temperature rising and dropping process, the temperature of the liquid crystal film is brought infinitesimally close below to the liquid crystal phase transition temperature for a limited length of time window. It is during this limited length of time window that the low power hot spot is detectable.

Item (5): A radiative heating system hardware to represent the heating device discussed in item (4).

To make it easy for the reader to follow, I have chosen the radiative heating system discussed in Item (5) to illustrate how the heating device works and how all the invented processes are related to each other. However, this does not mean that the radiative heating system is the only heating device that will work well for this invention. This invention refers to the heating device as either a conductive heating device, a convective heating device, or a radiative heating device.

For the radiative heating system, both the collimating of the radiative heating light source and the direct overhead heating of the liquid crystal film have helped the formation of an even temperature profile on the liquid crystal film. Both the rapid response of the heating filament temperature and the direct overhead heating have helped to create a rapid temperature response from the liquid crystal film. The method of turning on and then turning off the radiative heating light source method allows the liquid crystal temperature to rise beyond and then drop below the phase transition temperatures of the liquid crystal. While the liquid crystal temperature rises across a phase transition temperature, there exists a limited length of time window when the liquid crystal temperature is arbitrarily close to the liquid crystal phase transition temperature. During this limited length of time, an infinitesimally heat dissipation from the location in the integrated circuit to the liquid crystal film could induce a localised phase transition in a liquid crystal film. In other words, the turning on and then turning off the radiative heating light process enables the temperature of the liquid crystal to be brought within an arbitrarily small range of a pre-specified temperature, for a limited length of time window. For example, with a carefully selected power level of the radiative heating light, the liquid crystal temperature is brought to less than 0.001 degree Celsius just below the liquid crystal phase transition temperature, for more than a few seconds. Essentially, there is no limit to how close this invented infinitesimal temperature control method can control a temperature to within a specified temperature. Therefore, in the application of this invention to the liquid crystal hot spot detection method, the lowest wattage of a detectable hot spot is not limited by the ability to control the temperature of the liquid crystal film, but by the width of the temperature bands of the liquid crystal phase transition temperatures. Prior to this invention, the lowest wattage of a detectable hot spot was limited by the ability to control the temperature of liquid crystal film.

One of the nematic liquid crystals used for this invention is 4 cyano-4'hexyl-biphenyl. It is sold by E.M. Chemical under the trade name of K-18 nematic liquid crystal. I found it has 4 phase transition temperatures; the temperature band width of each phase transition is estimated to be on the order of 0.001 degree Celsius. All the phase transitions lie within 28.5 and 30.0 degree Celsius. The exact temperature of each phase transition is not measured, and is not important to this invention. The K-18 nematic liquid crystal is not the only chemical that works well for this invention. The selection of the electrical input power at 1.2 Hz and at 50% duty cycle to the hot spot of the die or wafer produces the optimal observable and differentiable hot spot blinking effect. The process of turning the radiative heating light on and off permits the ambient temperature of the liquid crystal to vary with the time. Below the phase transition temperature of the liquid crystal, the size of the hot spot induced blinking increases as the ambient temperature increases, but the size of the voltage induced blinking does not respond to ambient temperature changes. The invented process of turning on and then off the radiative heating provides a means to differentiate the hot spot induced blinking from a voltage induced blinking. In this SUMMARY OF THE INVENTION and the DETAILED DESCRIPTION OF THE INVENTION, I have only described and radiative heating system as the means to control the liquid crystal temperature to infinitesimally close below to the liquid crystal phase transition temperature. It should be understood that other forms of heating designs, such as a conductive hot chuck or a convective heat oven, as long as they are repeatedly operated in a turning on and turning off mode, are also capable of controlling the liquid crystal temperature to infinitesimally close below to the liquid crystal phase transition temperature. Therefore, the invented infinitesimal temperature control method can be applied to other forms of heating means that operate at a repeatedly turning on and off mode; this invention is not just limited to the described radiative heating system. Although we chose the nominal electrical input power as 1.2 Hz and at 50% duty cycle, it should be understood that the choice of other frequency and duty cycles will also yield similar results. Therefore, this invention also is able to operate at other than 1.2 Hz and other than 50% duty cycle.

BRIEF DESCRIPTION OF THE DRAWING

FIG. 1 shows the set-up of the invention.
FIG. 2 shows the temperature of the liquid crystal film and the heating up time.

DETAILED DESCRIPTION OF THE INVENTION

Use a signal generator to generate a low frequency signal 1. (refer to FIGS. 1 and 2) The frequency of signal 1 is 60 hertz or lower. The preferred signal frequency of signal 1 is around 1.2 Hz. The advantages of 1.2 Hz are (a) 1.2 Hz is slow enough for visual observation; (b) 1.2 Hz is very close to the human heart beat rate; therefore humans can easily identify a 1.2 Hz when encountered; and (c) 1.2 Hz is fast enough to form enough number of optical observation phase changes during a short "time window", in which only during the time window the hot spot induced blinking is visible.

The frequency of signal 1 is lower than 60 Hz, because human eyes cannot see an optical image change with a frequency higher than 60 Hz. The signal 1 is used to control a switch. The switch can be either a relay or a solid state switch. For illustration, this switch is a relay switch 2. The relay switch 2 can be either an on/off switch or a variable switch. The on/off relay switch is the preferred switch, because the relay switch has no leakage current. The time lengths of the "on" mode and "off" mode of the relay switch 2 is controlled by the wave form, the duty cycle, and the frequency of the signal 1. Any "on" and "off" mode time lengths wound enable the invention to function. The pattern of the preferred "on" and "off" time lengths is: (a) the "on" time length and the "off" time length are equal, (b) the "on" time length and the "off" time lengths are each equal to 0.6 seconds. An equal time length produces a maximum optical resolution for observing the hot spot induced blinking, at a given signal 1's frequency. The 0.6 seconds time length is chosen because the hot spot induced blinking is slow enough for human eyes to observe, yet fast enough to generate enough number of observable hot spot induced blinking during the short time window. It should be noted that other "on" and "off" time length combinations will also work for this invention.

The relay switch 2 is used to chop the D.C. 9 into square wave voltage 3 of 1.2 Hz and 50% duty cycle. The square wave voltage 3 is the input to the device under test 4, which is the die 17 or wafer 40 under test. The whole surface of the device under test has been spread with an even and thin film of nematic liquid crystal. The thickness of the liquid crystal film 28 is adjusted to within a specific working range. The thickness adjustment and the thickness determination procedures consist of the following 3 steps:

Step T1: Adjust the light analyser 8 and the ight polarizer 16 such that they optically cross polarized.

Step T2: Allow the liquid crystal to cool down below its phase transition temperatures.

Step T3: View the liquid crystal film 28 on the device under test 4 from the viewing position 12, through the microscope 15. If the liquid crystal thickness is too thin or there is no liquid crystal at all, the die surface and the liquid crystal would look very dark. Use syringe to spread more nematic liquid crystal onto the die surface, and, use a sharp tipped paper corner to even out the nematic liquid crystal film 28. If the nematic liquid crystal film 28 is transparent but not showing any rainbow color, the nematic liquid crystal film 28 is too thick, use a sharp corner paper to absorb the extra nematic liquid crystal. When the nematic liquid crystal film 28 thickness reached the optimal working range, the nematic liquid crystal film 28 would look very colorful and transparent. The optimal thickness of the nematics liquid crystal varies from one chemical to another. For the k-18 nematic liquid crystal, the optimal thickness is estimated to be in the range of a tenth of a mil.

A heat absorber 10 is placed on the path of the microscope illuminating light 11. The cool light source 20 would have minimum interference on the liquid crystal temperature.

The heating system consists of two power supplies. The D.C. power supply is preferred over A.C, because D.C. gives a steady voltage reading. Each of these power supplies has a variable power control, an on-off switch, a digital voltmeter in series, and one or more light bulbs in parallel. The preferred light bulbs are those with a co-planar filament. A co-planar filament is a requirement for an even heating light. The power supply 5 has a maximum output of around 50 watts; it is for coarse temperature control. The power supply 18 is for fine temperature control; it has a wattage of about a factor of 100 to 1000 lower than power supply 5. The dual switch 23 is capable of turning on or off both power supplies 5 and 18 concurrently. The heating lights 7, 24, 25 and 26 each has a co-planar filament and an objective lens. The heating lights 7 and 25 are connected to power supply 5 in an identical manner. Similary, the heating lights 24 and 26 are connected to power supply 18 in an identical manner. The lenses are adjusted to form even and well collimated light beams. The beams are incident at an angle about 45 degrees from the axis vertical to the surface of the device under test 4. The preferred configuration is the heating lights 7 and 25 facing each other; the heating lights 24 and 26 are also facing each other. This configuration will cancel the effects of the optical dispersion and the geometrical attenuation; these effects exist in a single heating light design.

To operate the system, the following steps are taken:

Step S1: Adjust the curve tracer 14 to a desired power level. Turn on the on/off switch 27. Turn on the signal generator 13.

Step S2: Cross polarize the light analyzer 8 and the light polarizer 16.

Step S3: Collimate the heating lights 7, 24, 25 and 26.

Step S4: Place the device under test 4 on the microscope stage 29. Use a syringe to spread a layer of nematic liquid crystal film 28 on the surface of the device under test 4. Use a cut paper to adjust the thickness as well as to even out the nematic liquid crystal film 28 while viewing the nematic liquid crystal film 28 through viewing position 12. The nematic liquid crystal film 28 will be at an optimal thickness when the nematic liquid crystal film 28 shows a transparent and rainbow color all over the surface of the device under test 4.

Step S4: Adjust the power supply 5 till the solid state temperature sensor 21 reads a temperature of about 0.2 degree Celsius below the phase transition temperature 32. Allow 10 minutes for the nematic liquid crystal film 28 and die 17 to reach their equalibrium temperatures. Then select a setting for the power supply 18. Turn on the heating light switch 22. Time the length of time required for the nematic liquid crystal film 28 to cross the phase transition temperature 32. The longer the length of time 35, the more sensitive is this invention in detecting a low wattage hot spot. I found that if the length of time 35 was 10 minutes, a 10 microwatts of pointed source hot spot could be located. If the length of time 35 was 15 minutes, a 2 microwatts of pointed source hot spot could be located. However, further increase in the length of time 35 beyond 20 minutes would not further improve the sensitivity of this invention. At this temperature changing rate, the most limiting factor is the temperature band widths of the phase transition temperatures 32, 36 and 37. For K-18 nematic liquid crystal, each is estimated to be in the order of 0.001 degree Celsius. Considering all the heat transfer properties of a typical integrated circuit and the K-18 nematic liquid crystal, the lowest detectable wattage of a hot spot is in the order of 1 microwatt.

After the desired power level setting of the power supply 18 is selected, turn off the heating light switch 22.

Step S5: Turn on the on-off switch 27 to allow the square wave voltage 3 to be input to the device under test 4. If the input voltage was high enough (about 2 volts for K-18 nematics liquid crystal), the pulsing square wave voltage 3 would induce a cyclic disturbance in the nematic liquid crystal film 28. This cyclic disturbance will show up as a blinking appearance when viewed through the viewing position 12. The blinking is actually a combination of cyclic changes in transparency, brightness and colors. If the input wattage was high enough to induce a cyclic localized phase transition, the appearance of this cyclic phase transition is very similar to pulsing voltage induced blinking. I shall discuss in step S6 how to differentiate the two kinds of blinkings.

If the voltage was lower than 2 volts, and if the input wattage was high enough (typically in the order of 500 microwatts), only the localized cyclic phase transition alone would appear as a blinking spot. If the localized phase transition does not show up at 2 volts, additional heating (described in step S6) is required.

Step S6: Turn on the heating light switch 4. Allow the ambient temperature of the nematic liquid crystal film 28 to continue to rise. As the temperature continues to rise, the blinking spot induced by the localized phase transition will increase in size, or from nothing to an enlarging blinking spot. I call this blinking the 'hot spot induced blinking'. For the voltage induced blinking, the change of temperature change has hardly any effect on the blinking spot size, as long as the liquid crystal temperature is below the phase transition temperature 32. Those hot spots with higher power dissipation are the first to show up as hot spot induced blinkings. Those lower power dissipating hot spots are the last to show the blinking appearance. If the hot spot was at 2 microwatts, it would only show up for a few seconds, at just before the temperature of the nematic liquid crystal film 28 rises beyond the phase transition temperature 37. At any temperature higher than the phase transition temperature 37, both the voltage and hot spot induced blinkings cease to blink; also, the nematic liquid crystal film 28 becomes opaque and dark. This particular property is used to determine whether the temperature of the liquid crystal film 28 is below or beyond the phase transition temperature 37. Step S6 can be repeated by turning off the light heating switch 22 to allow the ambient temperature of the nematic liquid crystal film 28 to drop below the phase transition temperature 32. Then repeat step S6 from the beginning. In the BRIEF DESCRIPTION OF THE DRAWING and in this DETAILED DESCRIPTION OF THE INVENTION, I have described only a 4-heating light system which consists of heating lights 7, 24, 25, 26 and power supplies 5 and 18. It should be noted that other forms of heating means, such as only a single heating light design, or a conductive hot chuck, or a convective heat oven, can also control the liquid crystal temperature, such that the temperature of the nematic liquid crystal film 28 will exhibit a time profile as depicted in FIG. 2, that is, bringing the liquid crystal film temperature infinitesimally close below to the liquid crystal phase transition temperature 22. Therefore, this invention will work with other types of heating devices, as long as the heating devices are operated with the infinitesimal temperature control method.

For a typical pointed source hot spot of a typical integrated circuit (for example, a filament type of short in the diode of a input pad of a DL 2416 integrated circuit), this method has been shown to be able to locate the center of the hot spot within 0.3 microns.

I claim:

1. In a method of detecting a hot spot on a die or a wafer, said method comprises:

applying a liquid crystal to form a liquid crystal film on the top surface of said die or said wafer, adjusting the thickness of said liquid crystal film with a thickness adjustment process;

placing said die or said wafer on the stage of a microscope that has a polarized illuminating light and an analyser, said analyser is placed on the viewing path of said microscope, said polarizer and said polarized illuminating light are cross polarized; said polarized illuminating light illuminates said die or said wafer that are placed on said stage;

delivering a current to the site of said hot spot of said die or said wafer by a current injecting means;

controlling the temperature of said liquid crystal film with a temperature control means;

locating a change in optical property on said liquid crystal film by a means of viewing said liquid crystal film through said analyser, using a differentiation means to confirm said change is induced by a localized phase transition in said liquid crystal film, thus said hot spot is located at location where said localized phase transition takes place;

wherein the improvement comprises:

an infinitesimal temperature control method for controlling the temperature of said liquid crystal film;

said infinitesimal temperature control method comprises an operation on a heating system;

said heating system comprises:

a power supply means; a heat generating means; and an adjustment means;

said power supply means delivers power to said heat generating means, said heat generating means generates heat for heating up said liquid crystal film, said adjustment means controls the heating output magnitude of said heat generating means, said adjustment means also controls the turning on and turning off of said heat generating means, the action of said turning on and turning off of said heat generating means brings said temperature of said liquid crystal film to an infinitesimally close below the phase transition temperature of said liquid crystal for a limited length of time, whereby enabling said hot spot of an arbitrary small power level on said die or said wafer to produce said localized phase transition in said liquid crystal film, for said limited length of time; a reduction in said heating output magnitude prolongs said limited length of time, whereby increasing the chances of detecting said localized phase transition;

said operation comprises:

step (a): adjusting said adjusting means to an output level such that the combined heating from said heat generating means and said current is sufficient to heat up said liquid crystal film that at said site to beyond said phase transition temperature;

step (b): turning off said heating means to allow said liquid crystal film to be cooled below said phase transition temperature;

step (c): turning on said heat generating means to heat up said liquid crystal, till said liquid crystal film at said site is heated to beyond said phase transition temperature;

step (d): if said hot spot cannot be detected because said limited length of time is too short, then reducing said output level to a low output level such that the combined heating from said heat generating means and said current is still sufficient to heat up said liquid crystal film that at immediate adjacent area of said site to beyond said phase transition temperature; then repeating said step (b) and said step (c);

step (e): repeating said step (d) till said limited length of time is long enough such that said hot spot can be detected by said method.

2. The method as recited in claim 1, wherein said heat generating means comprises a heating lamp.

3. The method as recited in claim 2, wherein said heating lamp has a coplanar filament.

4. The method as recited in claim 1, wherein said thickness adjustment process comprises:
cooling down said liquid crystal film to below said phase transition temperature;
adding said liquid crystal to said liquid crystal film if said liquid crystal film appears to be dark when viewed through said microscope, or removing part of said liquid crystal from said liquid crystal film if said liquid crystal film appears to be transparent and colorless when viewed through said microscope;
performing the process of said adding or said removing till said liquid crystal film exhibits a transparent and rainbow color when viewed through said microscope.

5. The method as recited in claim 1, wherein said current is an alternating current.

6. The method as recited in claim 5, wherein said alternating current comprises:
a current with nominal frequency between 0.01 to 16 hertzs, a nominal duty cycle of 10 to 90%.

7. The method as recited in claim 5, wherein said differentiation means comprises:
identifying said change that appears as a blinking spot;
observing the response of said blinking spot to the variation in said liquid crystal film's ambient temperature:
said blinking spot is said hot spot if said blinking spot increases or decreases in blinking spot size as said liquid crystal film's ambient temperature increases or decreases respectively;
said blinking spot is not said hot spot if said blinking spot does not change in blinking spot size as said liquid crystal film's ambient temperature increases or decreases.

8. The method as recited in claim 7, wherein said differentiation means further comprises:
observing the frequency of said blinking spot, that is: said hot spot blinks at a frequency that is the same as the frequency of said alternating current; a non-hot spot which is a voltage induced blinking spot, blinks at faster than or equal to the frequency of said alternating current.

9. The method as recited in claim 1, wherein said liquid crystal comprises:
a nematic liquid crystal; or a cholesteric liquid crystal; or a smectic liquid crystal.

10. The method as recited in claim 1, wherein said liquid crystal is 4 CYANO-4'HEXYL-BIPHENYL, trade name is K-18 nematic liquid crystal.

11. A new use of liquid crystal for detecting hot spot on die or wafer with a hot spot detection method, said liquid crystal comprises:
4 CYANO-4'HEXYL-BIPHENYL, trade name is K-18 nematic liquid crystal, or
4 CYANO-4'PENTYL-BIPHENYL, trade name is K-15 nematic liquid crystal; or
4 CYANO-4'HEPTYL-BIPHENYL, trade name is K-21 nematic liquid crystal; or
4 CYANO-4'OCTYL-BIPHENYL, trade name is K-24 nematic liquid crystal; or
4 CYANO-4'NONYL-BIPHENYL, trade name is K-27 nematic liquid crystal; or
4 CYANO-4'DECYL-BIPHENYL, trade name is K-30 nematic liquid crystal; or
4 CYANO-4'UNDERDECYL-BIPHENYL, trade name is K-33 nematic liquid crystal; or
4 CYANO-4'DODECYL-BIPHENYL, trade name is K-36 nematic liquid crystal.

* * * * *

(12) EX PARTE REEXAMINATION CERTIFICATE (7987th)
United States Patent
Tang

(10) Number: US 4,682,857 C1
(45) Certificate Issued: Jan. 18, 2011

(54) LIQUID CRYSTAL HOT SPOT DETECTION WITH INFINITESIMAL TEMPERATURE CONTROL

(76) Inventor: Peng Tang, 20674 Acadia Ct., Cupertino, CA (US) 95014

Reexamination Request:
No. 90/006,696, Jul. 7, 2003

Reexamination Certificate for:
Patent No.: 4,682,857
Issued: Jul. 28, 1987
Appl. No.: 06/718,866
Filed: Apr. 2, 1985

(51) Int. Cl.
*G01R 31/26* (2006.01)
*G01R 31/22* (2006.01)
*G01R 31/28* (2006.01)
*G01R 31/265* (2006.01)
*G01R 31/308* (2006.01)
*G02F 1/13* (2006.01)

(52) U.S. Cl. .................... 349/199; 349/168; 349/186; 349/187; 324/537; 324/760; 324/770; 359/900

(58) Field of Classification Search .................. None
See application file for complete search history.

(56) References Cited

U.S. PATENT DOCUMENTS

| 3,934,199 A | 1/1976 | Channin | 324/158 |
| 4,647,478 A | 3/1987 | Formanek et al. | 427/164 |

FOREIGN PATENT DOCUMENTS

GB  1 442 802 A1  7/1976

OTHER PUBLICATIONS

E. M. Fleuren "A Very Sensitive, Simple Analysis Technique Using Nematic Liquid Crystals," 21st Annual Proceedings of the IEEE Reliability Physics Sy mposium, 1983, pp. 148–149.
Page 154 of EM Chemicals product catalog.
D. L. Burgess and P. Tan, "Improved Sensitivity for Hot Spot Detection Using Liquid Crystal," 22nd Annual Proceeding of the IEEE Reliability Physics Symposium, 1984, pp. 119–121.

(Continued)

*Primary Examiner*—Andrew Schechter

(57) ABSTRACT

This improvement is the process of using a few well collimated and even radiative hating lights to heat up the liquid crystal film, which is spread over the surface of the die of an integrated circuit. The radiative heating of the liquid crystal film from the top helps to form an even temperature profile on the liquid temperature film. The rapid time response of the heating filament temperature and the radiative heating process induces a rapid response in the liquid crystal film temperature. By repeatedly turning on and turning off the heating lights at an appropriate power setting, the temperature of the liquid crystal film will repeatedly rise above and drop below the liquid crystal phase transition temperature. During this temperature rise and drop process, the liquid crystal film temperature is brought to infinesimally close below to the liquid crystal phase transition temperature, for a limited length of time. We call this temperature control process the infinitesimal temperature control method. During this limited length of time, a small ohmic heating dissipated from the die into the liquid crystal film would induce a localized phase transition in the liquid crystal film. Under a cross polarized light, the nematic liquid phase transition process exhibit a change in the liquid crystal's transparency and colors. The transition process is most easily visible when the die is periodically dissipating heat into the liquid crystal film at a 1.2 Hz and at 50% duty cycle. At this periodic heat dissipating mode, the periodic phase transistion induces a blinking appearance at the region where the phase transition is taking place. I call this blinking the 'hot spot induced blinking'. This periodic ohmic heating is accompanied with periodic voltage change in the die. The voltage changes will induce a blinking appearance similar to the hot spot induced blinking. With the use of the infinitesimal temperature control method to vary the ambient temperature of the liquid crystal film the blinking spot size of the hot spot induced blinking increases as the ambient temperature increases. But the blinking spot size of the voltage induced blinking does not respond to temperature changes, as long as the liquid crystal's temperature is not beyond the phase transition temperature. Thus, the varied heating light provide a means to differentiate the two types of blinkings. We have illustrated heating lights as the means of heating up the liquid crystal film. However, if the heating lights were replaced by other heating means, such as a conductive hot plate, or a convective oven, the infinitesimal temperature control method would still work, as long as these alternate heating means were operated at a repeatedly turning on and turning off mode. Therefore, this hot spot detection process will also work well with other heating means.

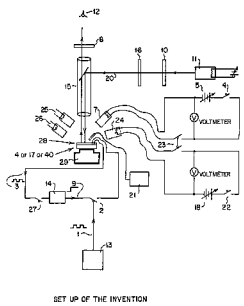

SET UP OF THE INVENTION

OTHER PUBLICATIONS

G. Aszodi et al., "High Resolution Thermal Mapping Of Microcircuits Using Nematic Liquid Crystals," Solid State Electronics, vol. 24, No. 12, 1981, 1127–1133.

C. Stephens and S. Sinnadurai, "A Surface Temperature Limit Detector Using Nematic Liquid Crystals with an Application to Microcircuits," Journal of Physics E: Scientific Instruments, vol. 7, 1974, 641–643.

Advanced Micro Devices Notice of Motion and Motion Under Fed. R. Civ. p. 56 for Summary Adjudication of Invaladity of Claim 11 of U.S. Patent No. 4,682,857 (35 U.S.C. §§ 101 and 112) Memorandum of Points and Authorities (U.S. District Court—NDCA; Case No. C99–05228(MMC)).

Plaintiff Peng Tan's Memorandum of Points and Authorities in Opposition to AMD's Motion for Summary Adjudication That Claim 11 of U.S. Patent No. 4,682,857 is Invalid (U.S. District Court—NDCA; Case No. C99–05228(MMC)).

Advanced Micro Devices Reply in Support of its Motion Under Fed. R. Civ. p. 56 for Summary Adjudication of Invaladity of Claim 11 of U.S. Patent No. 4,682,857 (35 U.S.C. §§ 101 and 112) (U.S. District Court—NDCA; Case No. C99–05228(MMC)).

Transcript of Proceeding in Pegn Tan V. AMD of Apr. 14, 2000 (U.S. District Court—NDCA; Case No. C99–05228(MMC)).

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1-10 is confirmed.

Claim 11 is cancelled.

\* \* \* \* \*